US009420800B1

(12) United States Patent
Froelicher et al.

(10) Patent No.: US 9,420,800 B1
(45) Date of Patent: Aug. 23, 2016

(54) OVEN APPLIANCE

(71) Applicant: General Electric Company, Schenectady, NY (US)

(72) Inventors: Stephen Bernard Froelicher, Louisville, KY (US); Christopher James Adelmann, Louisville, KY (US)

(73) Assignee: Haier US Appliance Solutions, Inc., Wilmington, DE (US)

(*) Notice: Subject to any disclaimer, the term of this patent is extended or adjusted under 35 U.S.C. 154(b) by 0 days.

(21) Appl. No.: 14/838,755

(22) Filed: Aug. 28, 2015

(51) Int. Cl.
| A47J 27/62 | (2006.01) |
| A47J 37/06 | (2006.01) |
| A47J 37/08 | (2006.01) |
| H05B 3/02 | (2006.01) |
| A21B 1/00 | (2006.01) |
| A21B 1/22 | (2006.01) |
| A21B 1/40 | (2006.01) |
| A21B 3/15 | (2006.01) |
| A21B 1/24 | (2006.01) |
| H01L 21/67 | (2006.01) |
| F24C 15/10 | (2006.01) |

(52) U.S. Cl.
CPC ... *A21B 1/40* (2013.01); *A21B 1/22* (2013.01); *A21B 1/24* (2013.01); *A21B 3/15* (2013.01); *A47J 37/0611* (2013.01); *A47J 37/0814* (2013.01); *F24C 15/106* (2013.01); *H01L 21/67115* (2013.01)

(58) Field of Classification Search
CPC ...... F24C 14/02; F24C 15/106; F24C 15/325; F24C 15/105; F24C 7/00; H01L 21/67115; H05B 6/6476; H05B 3/68; H05B 3/746; H05B 2213/05; H05B 2213/07; H05B 2213/04; H05B 1/0208; F26B 3/30; F27D 11/02; A47J 37/015; A47J 37/0676; A47J 37/0814; A47J 37/0611
USPC ........... 99/331, 451, 483, 447, 339, 389, 390; 219/413, 405, 411, 486, 400, 681, 410, 219/406, 408, 417, 443.1, 446.1, 447.1, 219/448.11, 448.12, 448.13, 448.14, 219/448.15, 448.16, 448.17, 448.18, 219/448.19, 450.1; 392/416
See application file for complete search history.

(56) References Cited

U.S. PATENT DOCUMENTS

| 4,558,208 | A | * | 12/1985 | Sturdevant | F24C 7/00 165/96 |
| 5,726,423 | A | * | 3/1998 | Westerberg | A47J 27/62 219/411 |
| 5,883,362 | A | * | 3/1999 | Pettibone | F24C 7/06 219/411 |
| 5,919,039 | A | * | 7/1999 | Shaw | A21B 1/40 219/388 |
| 6,087,634 | A | * | 7/2000 | Cook | F24C 15/16 219/392 |
| 6,463,844 | B1 | * | 10/2002 | Wang | A21B 3/13 99/400 |
| 8,006,685 | B2 | * | 8/2011 | Bolton | A21B 1/245 126/19 R |
| 8,929,724 | B1 | | 1/2015 | Mograbi | |

(Continued)

*Primary Examiner* — Dana Ross
*Assistant Examiner* — Hemant Mathew
(74) *Attorney, Agent, or Firm* — Dority & Manning, P.A.

(57) ABSTRACT

An oven appliance includes a baking stone positioned within a housing at a bottom portion of a cooking chamber. A controller is in operative communication with an upper heating element array, a lower heating element array, a pair of upper temperature sensors and a pair lower temperature sensors. The controller is configured for independently operating each of a first zone of the upper heating element array, a second zone of the upper heating element array, a first zone of the lower heating element array and a second zone of the lower heating element array.

15 Claims, 5 Drawing Sheets

(56) References Cited

U.S. PATENT DOCUMENTS

| | | | |
|---|---|---|---|
| 2003/0034342 A1* | 2/2003 | Stockley | A47J 37/0623 219/486 |
| 2005/0217503 A1* | 10/2005 | McFadden | A21B 1/245 99/476 |
| 2005/0224064 A1* | 10/2005 | Stockley | F24C 15/16 126/21 R |
| 2008/0105135 A1* | 5/2008 | McFadden | A21B 1/245 99/330 |
| 2009/0008379 A1 | 1/2009 | Ingemanson | |
| 2010/0193507 A1* | 8/2010 | Zimmer | H05B 6/6485 219/681 |
| 2011/0283895 A1* | 11/2011 | Veltrop | A23L 1/0128 99/451 |
| 2013/0133526 A1* | 5/2013 | Shealy | A47J 37/0623 99/325 |

* cited by examiner

OVEN APPLIANCE

FIELD OF THE INVENTION

The present subject matter relates generally to oven appliances, such as pizza oven appliances.

BACKGROUND OF THE INVENTION

Pizza ovens generally include a housing that defines a cooking chamber for receiving a pizza for cooking Heating elements, such as gas burners, or combusting wood heat the cooking chamber to a suitable temperature. Certain pizza ovens operate at high temperatures. For example, the operating temperatures of such pizza ovens can be higher than five hundred degrees Fahrenheit.

Uniformly heating food items within pizza ovens operating at high temperatures poses challenges. For example, high temperature gradients within a pizza stone of the pizza oven can unevenly heat a pizza on the pizza stone. However, adjusting operation of the pizza oven to account for such temperature gradients can be difficult and slow.

Accordingly, a pizza oven with features for evenly heating a pizza stone of the pizza oven would be useful. In particular, a pizza oven with features for limiting hot spots on a pizza stone of the pizza oven would be useful.

BRIEF DESCRIPTION OF THE INVENTION

The present subject matter provides an oven appliance with a baking stone positioned within a housing at a bottom portion of a cooking chamber. A controller is in operative communication with an upper heating element array, a lower heating element array, a pair of upper temperature sensors and a pair lower temperature sensors. The controller is configured for independently operating each of a first zone of the upper heating element array, a second zone of the upper heating element array, a first zone of the lower heating element array and a second zone of the lower heating element array. Additional aspects and advantages of the invention will be set forth in part in the following description, or may be apparent from the description, or may be learned through practice of the invention.

In a first exemplary embodiment, an oven appliance is provided. The oven appliance includes a housing that defines a cooking chamber. An upper heating element array is positioned within the housing at a top portion of the cooking chamber. The upper heating element array has a first zone and a second zone. The oven appliance also includes a pair of upper temperature sensors. Each temperature sensor of the pair of upper temperature sensors is positioned adjacent a respective one of the first and second zones of the upper heating element array. A baking stone is positioned within the housing at a bottom portion of the cooking chamber. A lower heating element array is positioned within the housing below the baking stone adjacent the bottom portion of the cooking chamber. The lower heating element array has a first zone and a second zone. The oven appliance also includes a pair of lower temperature sensors mounted to the baking stone. Each temperature sensor of the pair of lower temperature sensors is positioned adjacent a respective one of the first and second zones of the lower heating element array. A controller is in operative communication with the upper heating element array, the lower heating element array, the pair of upper temperature sensors and the pair lower temperature sensors. The controller is configured for independently operating each of the first zone of the upper heating element array, the second zone of the upper heating element array, the first zone of the lower heating element array and the second zone of the lower heating element array.

In a second exemplary embodiment, an oven appliance is provided. The oven appliance includes a housing that defines a cooking chamber. An upper heating element array is positioned within the housing at a top portion of the cooking chamber. The upper heating element array has a first zone and a second zone. The oven appliance also includes a pair of upper temperature sensors. Each temperature sensor of the pair of upper temperature sensors is positioned adjacent a respective one of the first and second zones of the upper heating element array. A baking stone is positioned within the housing at a bottom portion of the cooking chamber. A lower heating element array is positioned within the housing below the baking stone adjacent the bottom portion of the cooking chamber. The lower heating element array has a first zone and a second zone. The oven appliance also includes a pair of lower temperature sensors mounted to the baking stone. Each temperature sensor of the pair of lower temperature sensors is positioned adjacent a respective one of the first and second zones of the lower heating element array. A controller is in operative communication with the upper heating element array, the lower heating element array, the pair of upper temperature sensors and the pair lower temperature sensors. The controller is configured for independently operating the first zone of the upper heating electrical element in response to temperature measurements from a first one of the pair of upper temperature sensors and for independently operating the second zone of the upper electrical heating element array in response to temperature measurements from a second one of the pair of upper temperature sensors. The controller also configured for independently operating the first zone of the lower electrical heating element array in response to temperature measurements from a first one of the pair of lower temperature sensors and for independently operating the second zone of the lower electrical heating element array in response to temperature measurements from a second one of the pair of lower temperature sensors.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

DETAILED DESCRIPTION

Figure 1:
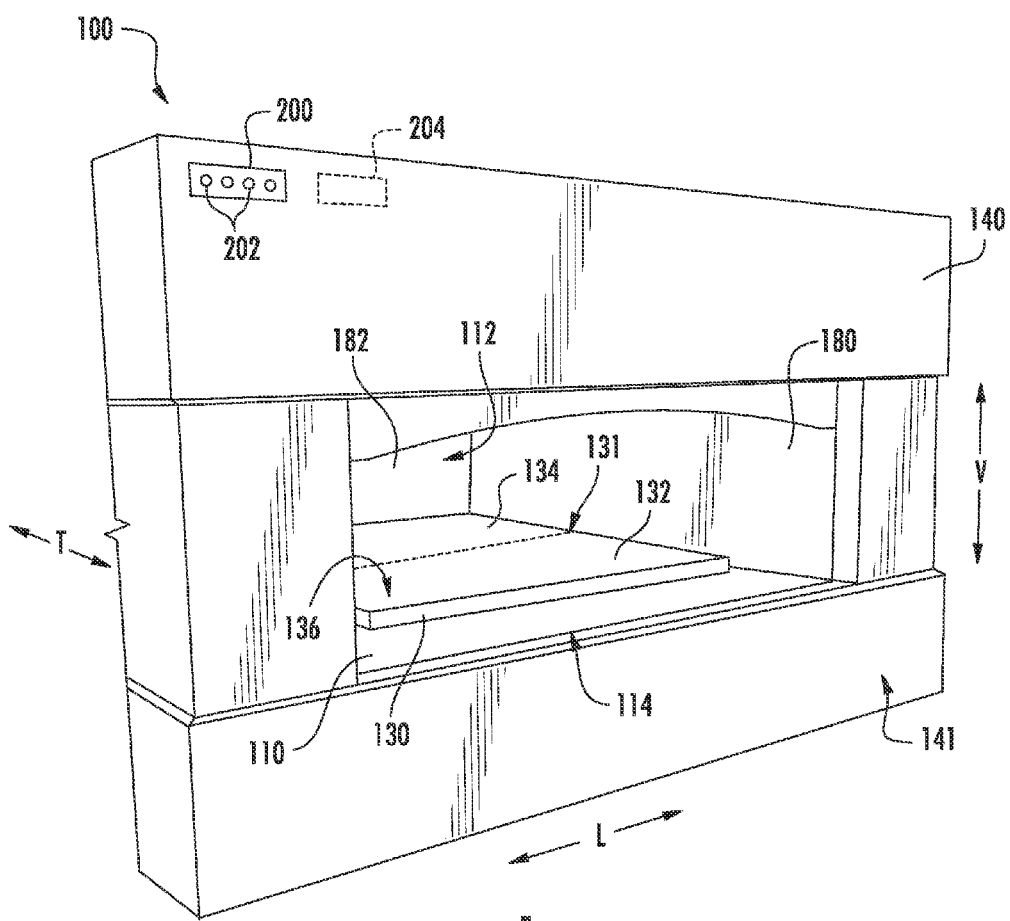
FIG. 1 provides a partial front, perspective view of an oven appliance according to an exemplary embodiment of the present subject matter.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

FIG. 1 provides a partial front, perspective view of an oven appliance 100 according to an exemplary embodiment of the present subject matter. As may be seen in FIG. 1, oven appliance 100 includes a housing 110 that defines a cooking chamber 112. Cooking chamber 112 is configured for receiving food items for cooking therein. In particular, housing 110 also defines an opening 114 for accessing cooking chamber 112. Opening 114 is positioned at a front portion 116 of housing 110, and a user of oven appliance 100 may place food items into and remove food items from cooking chamber 112 via opening 114. As may be seen in FIG. 1, cooking chamber 112 is open such that cooking chamber 112 is contiguous with or exposed to ambient atmosphere about oven appliance 100, e.g., about housing 110, via opening 114. Thus, oven appliance 100 does not include a door positioned at opening 114 for sealing opening 114.

A baking stone 130 is positioned within housing 110 at a bottom portion 120 of cooking chamber 112. Thus, baking stone 130 may form at least a portion of a floor of cooking chamber 112. Food items, such as pizza, may be placed directly on baking stone 130 during operation of oven appliance 100, as will be understood by those skilled in the art. Baking stone 130 may be constructed of or with any suitable material. For example, baking stone 130 may be constructed of or with a ceramic, clay or stone. In particular, baking stone 130 may be constructed of or with a porous ceramic or porous stone.

Oven appliance 100 also includes a manifold or casing 140. Casing 140 is mounted to housing 110 at opening 114 of housing 110. In particular, as shown in FIG. 1, casing 140 may extend about opening 114 of housing 110. Thus, a user may reach through opening 114 into cooking chamber 112 at casing 140. Casing 140 may have any suitable shape and/or appearance. For example, casing 140 may be rectangular with flat elements as shown in FIG. 1. In alternative exemplary embodiments, casing 140 may include column shaped elements, rounded elements, etc. Casing 140 may be formed of or with any suitable material. For example, an outer surface 141 of casing 140 may be constructed of or with stainless steel, painted steel, enameled steel, copper or combinations thereof.

Figure 2:
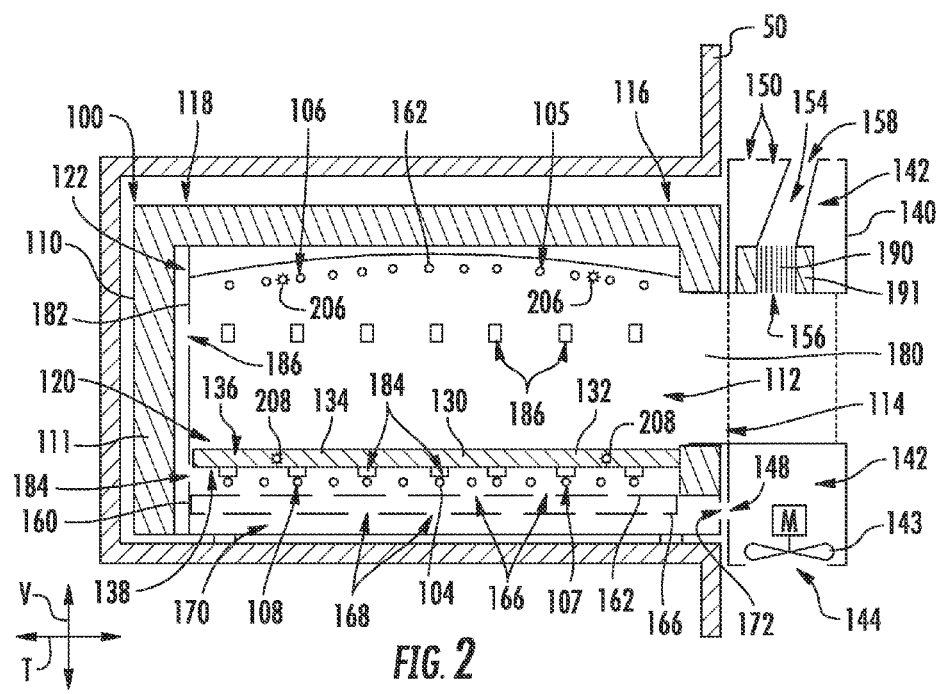
FIG. 2 provides a side section view of the exemplary oven appliance of FIG. 1 positioned within a cabinet.
Figure 3:
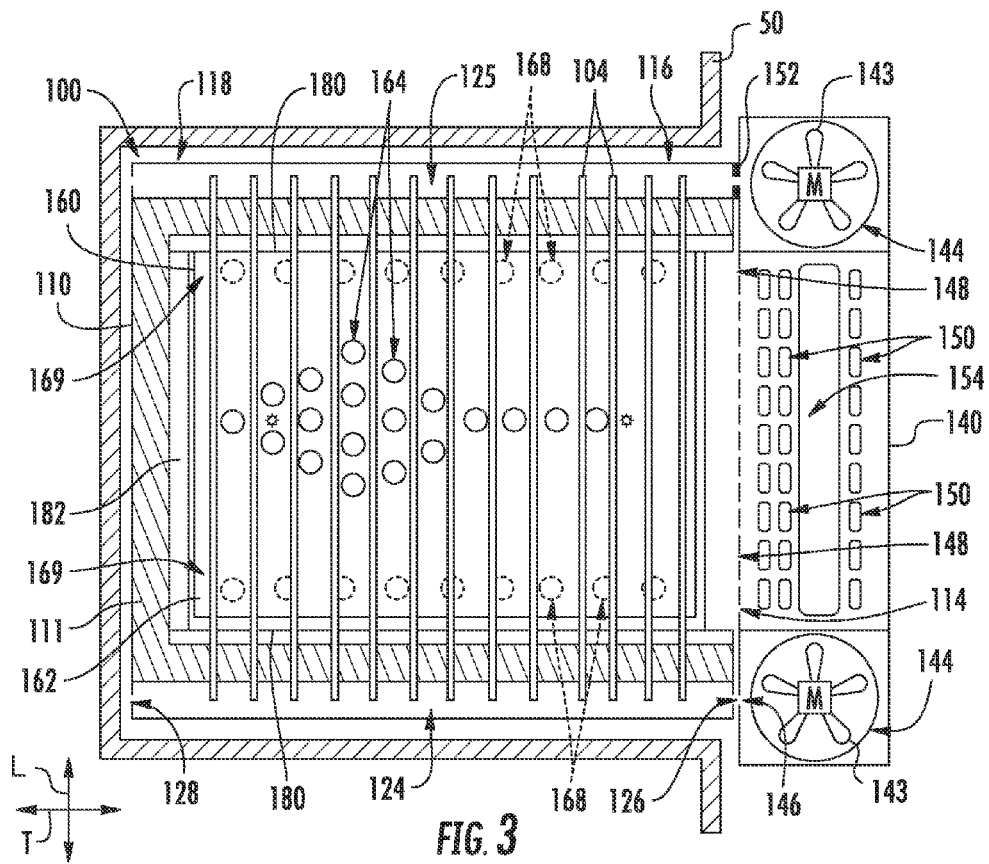
FIG. 3 provides a top section view of the exemplary oven appliance of FIG. 1 positioned within the cabinet.
Figure 4:
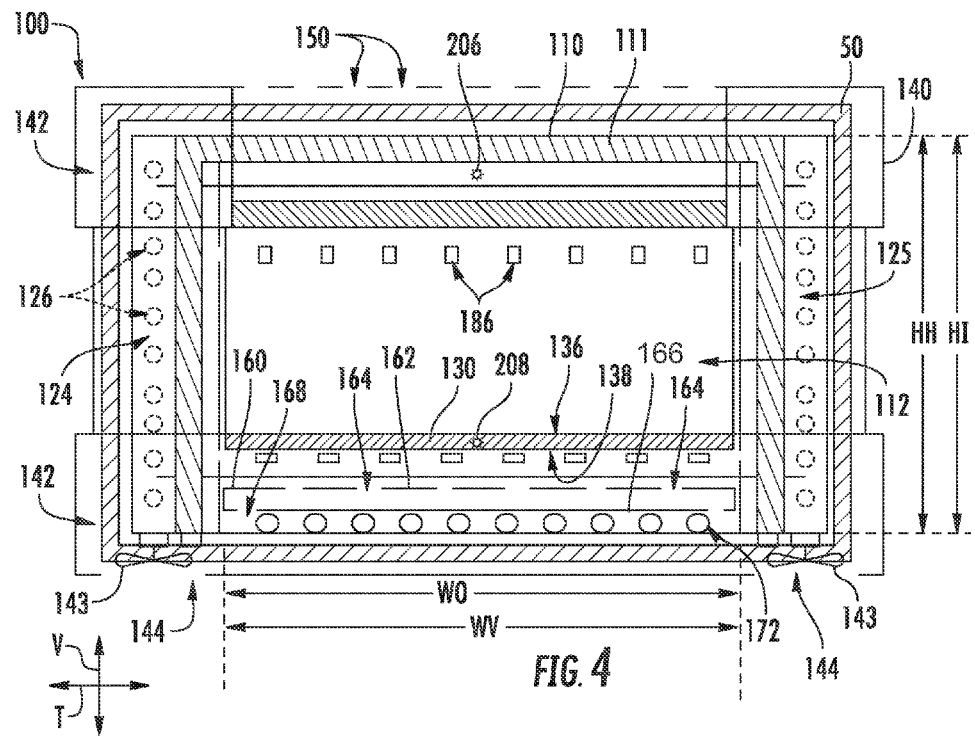
FIG. 4 provides a front elevation view of the exemplary oven appliance of FIG. 1 positioned within the cabinet.
Figure 6:
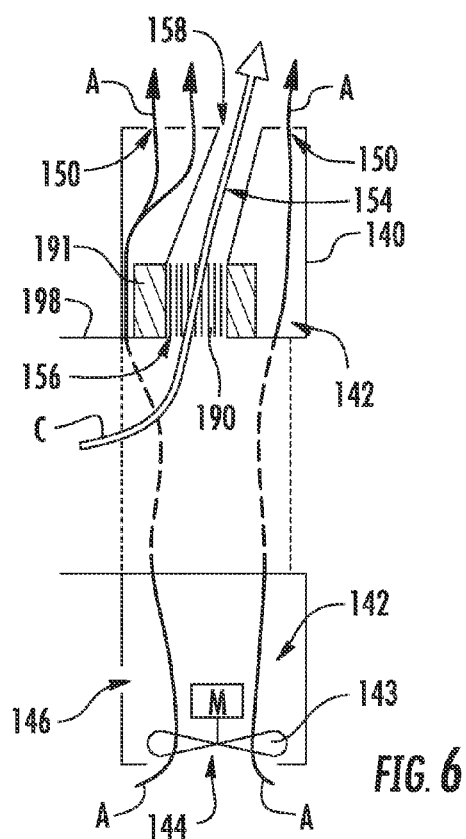
FIG. 6 provides a side section view of a manifold assembly of the exemplary oven appliance of FIG. 1.

FIG. 2 provides a side section view of oven appliance 100 positioned within a cabinet 50. FIG. 3 provides a top section view of oven appliance 100 positioned within cabinet 50. FIG. 4 provides a front elevation view of oven appliance 100 positioned within cabinet 50. As may be seen in FIGS. 2, 3 and 4 oven appliance 100 defines a vertical direction V, a lateral direction L and a transverse direction T. The vertical direction V, the lateral direction L and the transverse direction T are mutually perpendicular and form an orthogonal direction system. FIG. 6 provides a side section view of casing 140. Various features of oven appliance 100 are discussed in greater detail below in the context of FIGS. 2, 3, 4 and 6.

Oven appliance 100 includes heating element arrays for heating cooking chamber 112 and food items therein. In particular, an upper heating element array 102 is positioned within housing 110 at a top portion 122 of cooking chamber 112. In addition, a lower heating element array 104 is positioned within housing 110 below baking stone 130 adjacent bottom portion 120 of cooking chamber 112. Thus, lower heating element array 104 may not be directly exposed to cooking chamber 112, and baking stone 130 may be positioned between cooking chamber 112 and lower heating element array 104, e.g., along the vertical direction V. Upper and lower heating element arrays 102, 104 are electrical heating element arrays. In certain exemplary embodiments, upper and lower heating element arrays 102, 104 are constructed of or with electrical resistance heating elements, such as calrods.

As discussed above, casing 140 is mounted to housing 110. As may be seen in FIG. 2, casing 140 defines an air plenum 142. Thus, casing 140 may be hollow. Casing 140 also defines entrances 144, e.g., at a bottom of casing 140. Entrances 144 are contiguous with ambient air about housing 110. Thus, ambient air about housing 110 may flow into air plenum 142 via entrances 144. In particular, air handlers 143, such as fans, may operate to draw ambient air about housing 110 into air plenum 142 via entrances 144. Each air handler 143 may be positioned at a respective entrance of entrances 144, e.g., at the bottom of casing 140. Utilizing air handlers 143, air plenum 142 may be pressurized relative to ambient air about housing 110. From air plenum 142, the air within air plenum 142 may be supplied to various parts of oven appliance 100, e.g., to assist with cooling oven appliance 100, to assist with regulating a temperature of baking stone 130 and/or to assist with drawing treating cooking fumes from cooking chamber 112 of housing 110, as discussed in greater detail below.

Oven appliance 100 includes various features for limiting or reducing heat transfer from cooking chamber 112 to cabinet 50. For example, oven appliance 100 includes insulation 111 within housing 110, e.g., such that housing 110 is an insulated housing. Insulation 111 is positioned between cooking chamber 112 and cabinet 50. Oven appliance 100 also includes a baffle 160 within housing 110. Baffle 160 is positioned within housing 110 below lower heating element array 104. Thus, baffle 160 limits or reduces heat transfer between lower heating element array 104 and a floor of cabinet 50.

As may be seen in FIG. 2, baffle 160 includes an upper plate 162 and a lower plate 166. Upper plate 162 and lower plate 166 are spaced apart from each other, e.g., along the vertical direction V. Thus, a thermal break may be formed between upper plate 162 and lower plate 166, e.g., along the vertical direction V. As discussed in greater detail below, baffle 160 also includes features for directing a flow of air through baffle 160 to lower heating element array 104 and/or a bottom surface 138 of baking stone 130.

In addition to passive insulating elements discussed above, oven appliance 100 also includes features for actively cooling oven appliance 100. In particular, housing 110 defines a cooling air duct 124, e.g., at a side of housing 110. Cooling air duct 124 may be positioned between cooking chamber 112 and an outer surface of housing 110, e.g., along the lateral direction L, as shown in FIG. 4. In addition, insulation 111 of housing 110 may be positioned between cooling air duct 124 and cooking chamber 112 of housing 110, e.g., along the lateral direction L. As discussed in greater detail below, air flow though cooling air conduit 124 may assist with limiting or reducing heat transfer from housing 110 to cabinet 50 in which oven appliance 100 is positioned.

Cooling air conduit 124 includes an inlet 126 (or series of inlets) and an outlet 128 (or series of outlets). Inlet 126 of cooling air duct 124 is positioned at a front portion 116 of housing 110. Conversely, outlet 128 of cooling air duct 124 is positioned at a rear portion 118 of housing 110. Thus, inlet 126 and outlet 128 of cooling air duct 124 may be positioned opposite each other on housing 110 and spaced apart from each other, e.g., along the transverse direction T.

As shown in FIG. 4, inlet 126 of cooling air duct 124 is positioned adjacent and/or aligned with a first exit 146 (or series of exits) of air plenum 142. Thus, air from air plenum 142 of casing 140 may flow into cooling air duct 124 of housing 110 via first exit 146 of air plenum 142 and inlet 126 of cooling air duct 124. A gasket or seal 152 is positioned at a junction between housing 110 and casing 140 may extend between housing 110 and casing 140 in order to assist with limiting leakage of air from air plenum 142 to cooling air duct 124.

At the junction between housing 110 and casing 140, pressurized ambient air from about housing 110 may flow from air plenum 142 into cooling air duct 124. Within cooling air duct 124, air may flow within housing 110 from front portion 116 of housing 110 to rear portion 118 of housing 110, e.g., along the transverse direction T, and exit cooling air duct 124 at outlet 128 of cooling air duct 124. Air within cooling air duct 124 may assist with limiting or reducing heat transfer from housing 110 to cabinet 50 in which oven appliance 100 is positioned, as will be understood by those skilled in the art. In addition, the air from cooling air duct 124 may also flow between housing 110 and cabinet 50, e.g., from rear portion 118 of housing 110 to front portion 116 of housing 110 along the transverse direction T, in order to further assist with limiting or reducing heat transfer from housing 110 to cabinet 50 in which oven appliance 100 is positioned.

An additional cooling air duct 125 may be positioned at an opposite side of housing 110. Additional cooling air duct 125 may be constructed in the same or similar manner to cooling air duct 124 and operate in the manner described above for cooling air duct 124. Air duct 124 and additional cooling air duct 125 may be spaced apart from each other, e.g., along the lateral direction, and cool opposite sides of housing 110.

As may be seen in FIG. 4, inlet 126 of cooling air duct 124 defines a height HI (e.g., along the vertical direction V), and housing 110 also defines a height HH (e.g., along the vertical direction V). The height HI of inlet 126 may be about equal to the height HH of housing 110. As used herein, the term "about" means with ten percent of a stated height when used in the context of heights. Thus, inlet 126 (or a series of inlets 126 as shown in FIG. 4) of cooling air conduit 126 may extend along the height HH of housing 110 at front portion 116 of housing 110. Outlet 128 of cooling air conduit 124 may be similarly sized relative to housing 110.

Oven appliance 100 also includes features for regulating a temperature of baking stone 130. In particular, housing 110 also defines a regulating air duct 170, e.g., at a bottom portion of housing 110. As shown in FIG. 4, regulating air duct 170 includes an inlet 172 (or series of inlets) that is positioned adjacent and/or aligned with a second exit 148 (or series of exits) of air plenum 142. Thus, air from air plenum 142 of casing 140 may flow into regulating air duct 170 of housing 110 via second exit 148 of air plenum 142 and inlet 172 of regulating air duct 170. A gasket or seal 152 is also positioned at a junction between housing 110 and casing 140 may extend between housing 110 and casing 140 in order to assist with limiting leakage of air from air plenum 142 to regulating air duct 170.

Referring again to FIG. 2, upper plate 162 defines a plurality of holes 164, and lower plate 166 also defines a plurality of holes 168. As shown in FIG. 3, holes 164 of upper plate 162 are offset from holes 168 of lower plate 166, e.g., along the lateral direction L and/or transverse direction T. Thus, holes 164 of upper plate 162 may be unaligned with holes 168 of lower plate 166, e.g., along the vertical direction V. Such distribution of holes 164 of upper plate 162 relative to holes 168 of lower plate 166 may assist with limiting radiant heat transfer from lower heating element array 104 through baffle 160.

Holes 168 of lower plate 166 are contiguous with regulating air duct 170 of housing 110. In particular, air from regulating air duct 170 may flow into and enter baffle 160 through holes 168 of lower plate 166. The air may then flow between upper and lower plates 162, 166 to holes 164 of upper plate 162, and the air may exit baffle 160 at holes 164 of upper plate 162. After exiting holes 164 of upper plate 162, the air may flow along bottom surface 138 of baking stone 130 in order to assist with regulating a temperature of baking stone 130. In particular, the air exiting holes 164 of upper plate 162 may assist with cooling baking stone 130. Inlet 172 of regulating air duct 170 (or any other orifice of regulating air duct 170) may be metered to regulate the flow of air through regulating air duct 170 to baking stone 130.

Holes 164 of upper plate 162 and holes 168 of lower plate 166 may be distributed in any suitable manner relative to one another. For example, as shown in FIG. 3, holes 164 of upper plate 162 may be positioned proximate a central portion of upper plate 162, e.g., below a central portion 131 of baking stone 130. Conversely, holes 168 of lower plate 166 may be positioned proximate edge portions 169 of lower plate 166. As another example, as shown in FIG. 1, baking stone 130 may have a front half 132, e.g., positioned adjacent opening 114 of housing 110. Baking stone 130 may also have a rear half 134 positioned opposite opening 114 of housing 110 within cooking chamber 112 of housing 110. Turning back to FIGS. 2 and 3, holes 164 of upper plate 162 may be distributed such that more of the holes 164 of upper plate 162 are positioned below rear half 134 of baking stone 130 than front half 132 of baking stone 130. In particular, no less than twice as many of the holes 164 of upper plate 162 may be positioned below rear half 134 of baking stone 130 than front half 132 of baking stone 130. Further, holes 164 of upper plate 162 positioned below rear half 134 of baking stone 130 may be distributed in a diamond, and holes 164 of upper plate 162 positioned below front half 132 of baking stone 130 may be distributed in a line. Such distribution of holes 164 of upper plate 162 and holes 168 of lower plate 166 may assist with maintaining a uniform heat distribution at a top surface 136 of baking stone 130 while also limiting radiant heat transfer from lower heating element array 104 through baffle 160.

From baking stone 130, the air from holes 164 of upper plate 162 is directed away from baffle 160. In particular, housing 110 includes a pair of side panels 180 and a rear panel 182. Side panels 180 are positioned at and may assist with defining cooking chamber 112 of housing 110. Side panels 180 may be positioned opposite each other about cooking chamber 112 of housing 110, e.g., such that side panels 180 are spaced apart from each other along the lateral direction L.

Rear panel 182 is also positioned at and may assist with defining cooking chamber 112 of housing 110. Rear panel 182 is positioned adjacent rear position 118 of housing 110 and may extend between side panels 180, e.g., along the lateral direction L.

Side panels 180 and/or rear panel 182 define a plurality of inlet openings 184 and a plurality of outlet openings 186. As shown in FIG. 2, inlet openings 184 are positioned below baking stone 130 and above upper plate 162 of baffle 160, e.g., along the vertical direction V. Outlet openings 186 are positioned at and contiguous with cooking chamber 112 of housing 110. Outlet openings 186 may also be positioned below upper heating element array 102, e.g., along the vertical direction V. Inlet openings 184 are configured for receiving air from below baking stone 130, and outlet openings 186 are configured for directing the air into cooking chamber 112 of housing 110. Thus, from baking stone 130 and baffle 160, the flow of air from regulating air duct 170 may enter cooking chamber 112 of housing 110 and exit housing 110 at opening 114, as discussed in greater detail below.

Oven appliance 100 further includes features for assisting with venting cooking fumes and/or smoke into the ambient atmosphere about oven appliance 100. In particular, casing 140 defines a venting channel 154. Venting channel 154 extends between an entrance 156 and an exit 158. Entrance 156 of venting channel 154 is positioned, e.g., directly, over opening 114 of housing 110. Thus, entrance 156 of venting channel 154 may be contiguous with cooking chamber 112 of housing 110, and cooking fumes and/or smoke from cooking chamber 112 of housing 110 may enter and flow into venting channel 154 at entrance 156 of venting channel 154. Exit 158 of venting channel 154 is positioned above entrance 156 of venting channel 154, e.g., along the vertical direction V. Exit 158 of venting channel 154 is positioned such that exit 158 of venting channel 154 is contiguous with the ambient atmosphere about housing 110 and/or exposed to the ambient atmosphere about housing 110. Thus, cooking fumes and/or smoke from cooking chamber 112 of housing 110 may exit and flow out of venting channel 154 at exit 158 of venting channel 154. In particular, the cooking fumes and/or smoke from cooking chamber 112 of housing 110 may flow from exit 158 of venting channel 154 into the ambient atmosphere about housing 110. Entrance 156 of venting channel 154 may also be positioned above outlet openings 186, e.g., along the vertical direction V.

Venting channel 154 permits oven appliance 100 to vent cooking fumes and/or smoke into an interior atmosphere of a building housing oven appliance 100. Thus, oven appliance 100 need not include or be coupled to venting ducts that direct cooking fumes and/or smoke to an exterior atmosphere outside of the building housing oven appliance 100. Oven appliance 100 also includes features for treating the cooking fumes and/or smoke within venting channel 154, as discussed in greater detail below.

Entrance 156 and exit 158 of venting channel 154 may have any suitable sizes. For example, as shown in FIG. 4, entrance 156 of venting channel 154 may define a width WV, e.g., along the lateral direction L. Opening 114 of housing 110 may also define a width WO, e.g., along a lateral direction. The width WO of opening 114 may be substantially equal to the width WV of venting channel 154. As used herein, the term "substantially" means within ten percent of the stated width when used in the context of widths. Exit 158 of venting channel 154 may be similarly sized relative to opening 114 of housing 110.

As may be seen in FIG. 2, oven appliance 100 includes a smoke reduction catalyst 190. Smoke reduction catalyst 190 is positioned within venting channel 154 of casing 140, e.g., at entrance 156 of venting channel 154. Smoke reduction catalyst 190 is configured for reacting with cooking fumes and/or smoke within venting channel 154 in order to reduce emission of undesirable material from venting channel 154. Smoke reduction catalyst 190 may be any suitable smoke reduction catalyst. For example, smoke reduction catalyst 190 may include ceramic plates coated with a noble (non-reactive) metal, such as palladium. The ceramic plates of smoke reduction catalyst 190 may form a honeycomb or other suitable high surface area pattern. Insulation 191 is disposed within casing 140 opposite smoke reduction catalyst 190. Insulation 191 may assist with maintaining smoke reduction catalyst 190 at a suitable temperature.

Turning now to FIG. 6, oven appliance 100 may also include features for assisting with drawing cooking fumes and/or smoke (shown with arrow C) into or through venting channel 154. For example, casing 140 defines a third exit 150 (or series of exits) of air plenum 142. Third exit 150 of air plenum 142 is positioned at or adjacent venting channel 154. Thus, air from air plenum 142 of casing 140 (shown with arrows A) may flow near or into venting channel 154 via third exit 150 of air plenum 142. Third exit 150 of air plenum 142 is positioned above entrance 156 of venting channel 154, e.g., along the vertical direction V, on casing 140. Thus, air exiting air plenum 142 at third exit 150 of air plenum 142 may entrain or draw gases, such as cooking fumes and/or smoke, into entrance 156 of venting channel 154 or through venting channel 154. As shown in FIG. 6, third exit 150 of air plenum 142 may be positioned at top portion of casing 140 adjacent exit 158 of venting channel 154. As discussed in greater detail below, other positions for third exit 150 of air plenum 142 may be used in alternative exemplary embodiments.

Figure 7:
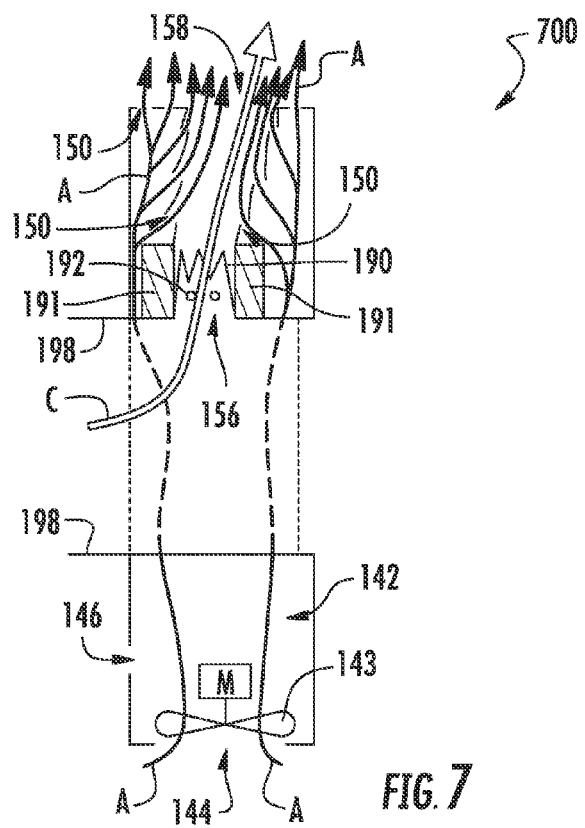
FIGS. 7, 8 and 10 provide side section views of manifold assemblies according to various exemplary embodiments of the present subject matter.
Figure 8:
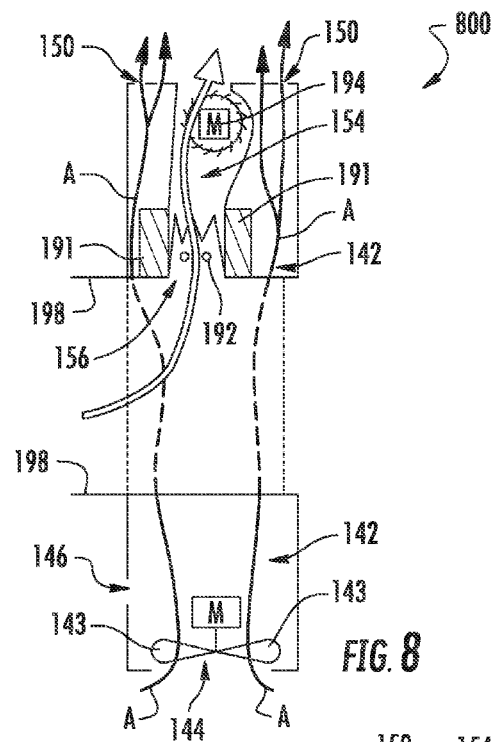
Figure 9:
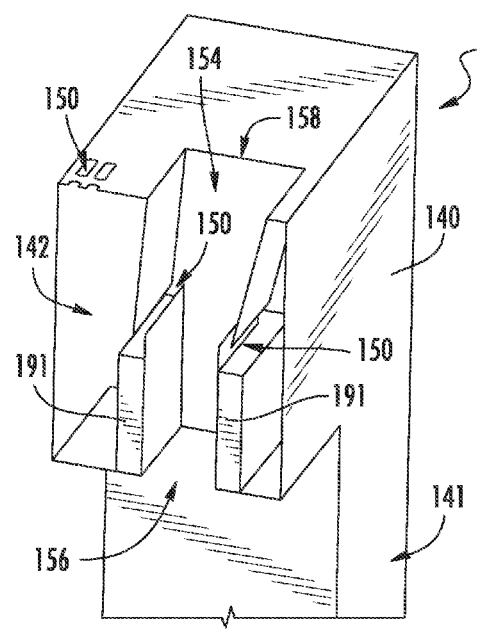
FIG. 9 provides a partial perspective, section view of the exemplary manifold assembly of FIG. 10.
Figure 10:
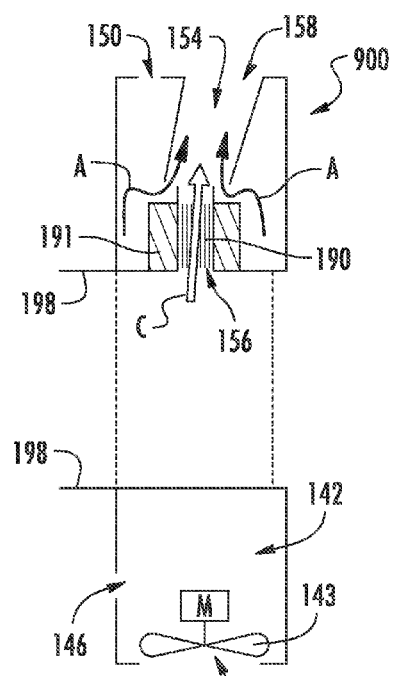

FIGS. 7, 8 and 10 provide side section views of casings 700, 800 and 900 according to various exemplary embodiments of the present subject matter. FIG. 9 provides a partial perspective, section view of casing 900. Casing 700, casing 800 and casing 900 include similar components as casing 140 and may be constructed and operate in the same or similar manner to casing 140 described above. Differences in the arrangement and/or features of components of casing 700, casing 800 and casing 900 are discussed in greater detail below.

Turning now to FIGS. 7 and 9, in conduits 700 and conduit 900, at least some of the openings of third exit 150 of air plenum 142 may be positioned at venting channel 154, e.g., such that third exit 150 of air plenum 142 is contiguous with venting channel 154. Thus, air exiting air plenum 142 at third exit 150 of air plenum 142 may flow into venting channel 154 and entrain or draw gases, such as cooking fumes and/or smoke, into entrance 156 of venting channel 154 or through venting channel 154. In addition, air exiting air plenum 142 at third exit 150 of air plenum 142 may also assist with cooling the cooking fumes and/or smoke flowing through or out of venting channel 154. Third exit 150 of air plenum 142 may also be formed or oriented such that air exiting air plenum 142 at third exit 150 of air plenum 142 flows towards exit 158 of venting channel 154, e.g., upwardly along the vertical direction V. In addition, smoke reduction catalyst 190 may be positioned below third exit 150 of air plenum 142 within venting channel 154, e.g., along the vertical direction V.

As shown in FIG. 7, oven appliance 100 may include a catalyst heating element 192 to facilitate operation of smoke reduction catalyst 190. Catalyst heating element 192 is also positioned at smoke reduction catalyst 190 and may be an electrical heating element, such as an electric resistance heating elements, that is operable to heat smoke reduction catalyst 190. As will be understood by those skilled in the art, smoke reduction catalyst 190 may be more efficient and/or effective at reacting with cooking fumes and/or smoke within venting channel 154 when heated above a temperature threshold.

Turning now to FIG. 8, in conduit 800, an air handler 194 is positioned within venting channel 154. Air handler 194 is operable to draw gases, such as cooking fumes and/or smoke, into entrance 156 of venting channel 154 or through venting channel 154. Thus, air handler 194 may be provided to actively draw cooking fumes and/or smoke into entrance 156 of venting channel 154 or through venting channel 154.

Figure 5:
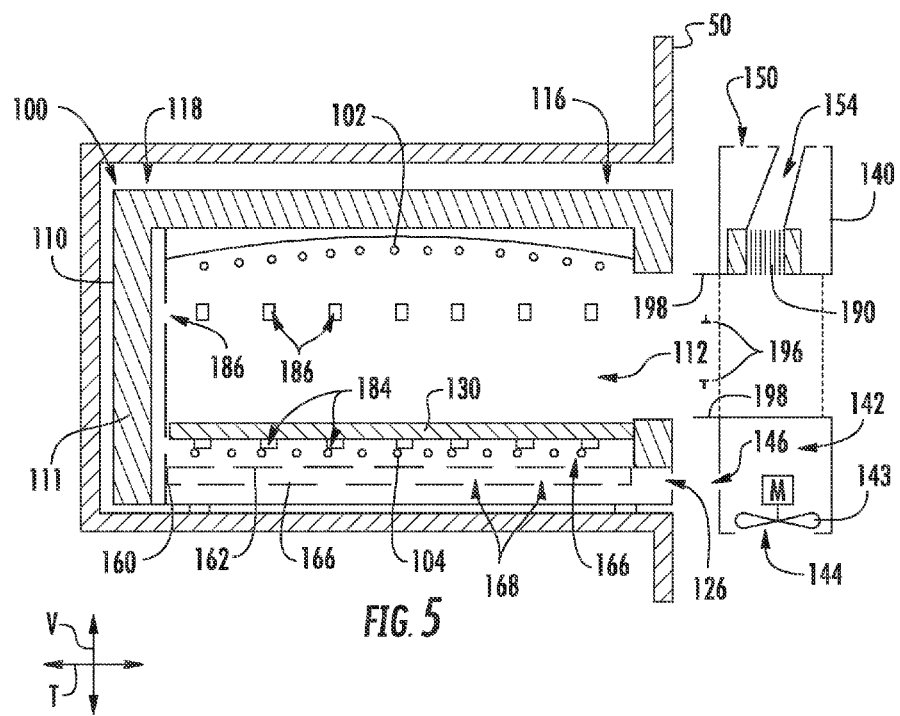
FIG. 5 provides a side section view of the exemplary oven appliance of FIG. 1 with a manifold assembly of the exemplary oven appliance removed from a housing of the exemplary oven appliance.

FIG. 5 provides a side section view of oven appliance 100 with casing 140 of oven appliance 100 removed from housing 110 of oven appliance 100. Thus, as shown in FIG. 5, casing 140 is removable from housing 110. In such a manner, a user may select a casing having a desired appearance and mount such casing to a common or uniform housing.

Casing 140 may be removably mounted to housing 110 using any suitable method or mechanism. For example, as shown in FIG. 5, oven appliance 100 may include a plurality of fasteners 196 to assist with mounting casing 140 to housing 110. Casing 140 has a flange 198 that extends towards housing 110, e.g., along the transverse direction T, proximate or at opening 114 of housing 110. Fasteners 196 may extend through flange 198 into housing 110 in order to mount casing 140 to housing 110. To remove casing 140 from housing 110, fasteners 196 may be withdrawn from housing 110.

With casing 140 removed from housing 110, any suitable casing may be mounted to housing 110. Thus, a plurality of interchangeable casings may be provided, in certain exemplary embodiments. Each casing of the plurality of interchangeable casings may have a unique cosmetic appearance, and a user of oven appliance 100 may select his or her desired casing from the plurality of interchangeable casings and mount the desired casing to housing 110, e.g., with fasteners 196, as discussed above.

Oven appliance 100 also includes features for assisting with regulating heating of cooking chamber 112 of housing 110 with upper and lower heating element arrays 102, 104. As shown in FIG. 2, upper heating element array 102 has a first zone 105 and a second zone 106. Oven appliance 100 also includes a pair of upper temperature sensors 206. Each temperature sensor of upper temperature sensors 206 is positioned at or adjacent a respective one of the first and second zones 105, 106 of upper heating element array 102, e.g., in direct thermal contact with the respective one of the first and second zones 105, 106 of upper heating element array 102. Lower heating element array 104 also has a first zone 107 and a second zone 108. Oven appliance 100 also includes a pair of lower temperature sensors 208. Each temperature sensor of lower temperature sensors 208 is positioned at or adjacent a respective one of the first and second zones 107, 108 of lower heating element array 104.

Lower temperature sensors 208 may be positioned within baking stone 130, as shown in FIG. 2. Thus, lower temperature sensors 208 may be embedded within the material of baking stone 130, and heater surface temperature measurements from lower temperature sensors 208 may correspond to the temperature of baking stone 130. Lower temperature sensors 208 may be positioned within baking stone 130 at a middle portion of baking stone 130, e.g., along the vertical direction V. In alternative exemplary embodiments, lower temperature sensors 208 may be positioned within baking stone 130 at or adjacent a top portion and/or a bottom portion of baking stone 130, e.g., along the vertical direction V. As will be understood by those skilled in the art, baking stone 130 may have a relatively low thermal conductivity, such that the temperature of baking stone 130 changes slowly. Thus, positioning lower temperature sensors 208 at a suitable vertical location within baking stone 130 may permit accurate measurement of the temperature of baking stone 130, e.g., at top surface 136 and bottom surface 138 of baking stone 130. In particular, having a lower temperature sensors 208 at both top surface 136 and bottom surface 138 of baking stone 130 may assist with regulating heating of cooking chamber 112 of housing 110.

First zone 105 of upper heating element array 102 may be positioned at or adjacent a front portion of cooking chamber 112, e.g., at or adjacent opening 114 of housing 110 and/or above front half 132 of basking stone 130. First zone 107 of lower heating element array 104 may be positioned below baking stone 130 adjacent the front portion of cooking chamber 112, e.g., below front half 132 of basking stone 130. Second zone 106 of upper heating element array 102 may be positioned at or adjacent a rear portion of cooking chamber 112, e.g., opposite opening 114 of housing 110 and/or above rear half 134 of basking stone 130. Second zone 108 of lower heating element array 104 may be positioned below baking stone 130 adjacent the rear portion of cooking chamber 112, e.g., below rear half 134 of basking stone 130.

Oven appliance 100 also includes a controller 204 for providing desired functionality for oven appliance 100. For instance, as will be described below, the controller 204 may be configured to control the activation and deactivation of upper and lower heating element arrays 102, 104 in order to regulate heating of cooking chamber 112 with upper and lower heating element arrays 102, 104. For instance, by controlling the operation of the upper and lower heating element arrays 102, 104, the controller 204 may be configured to control the various operating modes of the oven appliance 100, such as baking, roasting, broiling, cleaning and/or any other suitable operations.

It should be appreciated that controller 204 may generally comprise any suitable processor-based device known in the art. Thus, in several embodiments, controller 204 may include one or more processor(s) and associated memory device(s) configured to perform a variety of computer-implemented functions. As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. Additionally, the memory of controller 204 may generally comprise memory element(s) including, but are not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory may generally be configured to store suitable computer-readable instructions that, when implemented by the processor(s), configure controller 204 to perform various computer-implemented functions, such as by implementing embodiments of the heating element array operating algorithm disclosed herein. In addition, controller 204 may also include various other suitable components, such as a communications circuit or module, one or more input/output channels, a data/control bus and/or the like.

Turning back to FIG. 1, oven appliance 100 may also include a control panel 200 on casing 140. Control panel 200 may include one or more user-interface elements 202 (e.g., buttons, knobs, etc.) for receiving user inputs associated with controlling the operation of oven appliance 100. For instance, a user may utilize the user-interface elements 202 to input a desired oven temperature into controller 204. Controller 204 may then control the operation of oven appliance 100 (e.g., by activating/deactivating one or more of the first and second zones 105, 106 of upper heating element array 102 and the first and second zones 107, 108 of lower heating element array 104) so as to adjust the internal temperature within cooking chamber 112 of housing 110 to the user-selected temperature and/or to maintain the internal temperature at such user-selected temperature.

Moreover, controller 204 may be communicatively coupled to upper and lower temperature sensors 206, 208, e.g., for monitoring the internal temperature within cooking chamber 112 of housing 110. Specifically, upper and lower temperature sensors 206, 208 may be configured to transmit heater surface temperature measurements to controller 204. Controller 204 may then control the operation of the upper heating element array 102 and lower heating element array 104 based on the heater surface temperature measurements so as to heat the oven temperature up to and/or maintain such temperature at the user-selected temperature.

Accordingly, controller 204 is in operative communication with upper heating element array 102, lower heating element array 104, upper temperature sensors 206 and lower temperature sensors 208. Controller 204 is configured for independently operating each of the first zone 105 of upper heating element array 102, the second zone 106 of upper heating element array 102, the first zone 107 of lower heating element array 104 and the second zone 108 of lower heating element array 104. Controller 204 may operate the first zone 105 of upper heating element array 102 in response to heater surface temperature measurements from a first one of upper temperature sensors 206, and controller 204 may operate the second zone 106 of upper heating element array 102 in response to heater surface temperature measurements from a second one of upper temperature sensors 206. Similarly, controller 204 may operate the first zone 107 of lower heating element array 104 in response to heater surface temperature measurements from a first one of lower temperature sensors 208, and controller 204 may operate the second zone 108 of lower heating element array 104 in response to heater surface temperature measurements from a second one of lower temperature sensors 208.

Controller 204 may regulate the power output of the first zone 105 of upper heating element array 102, the second zone 106 of upper heating element array 102, the first zone 107 of lower heating element array 104 and the second zone 108 of lower heating element array 104 using any suitable method or mechanism. For example, controller 204 may utilize a triode for alternating current (TRIAC) and/or pulse-width modulation of a voltage supplied to a solid state relay to regulate the power output of each of the first zone 105 of upper heating element array 102, the second zone 106 of upper heating element array 102, the first zone 107 of lower heating element array 104 and the second zone 108 of lower heating element array 104.

By independently operating the first zone 105 of upper heating element array 102, the second zone 106 of upper heating element array 102, the first zone 107 of lower heating element array 104 and the second zone 108 of lower heating element array 104, a cooking performance of oven appliance 100 may be facilitated. In particular, such operating may provide uniform energy distribution to a food product within cooking chamber 112. For example, the opening 114 of housing 110 can provide a large thermal gradient between bottom and top portion 120, 122 of cooking chamber 112. Controller 204 may operate the zones of upper and lower heating element arrays 102, 104 to provide particular and/or unique amounts of power and energy to predefined zones in order to evenly heat the food product within cooking chamber 112.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An oven appliance, comprising:
a housing defining a cooking chamber;
an upper heating element array positioned within the housing at a top portion of the cooking chamber, the upper heating element array having a first zone and a second zone;
a pair of upper temperature sensors, each of the temperature sensors of the pair of upper temperature sensors positioned adjacent a respective one of the first and second zones of the upper heating element array;
a baking stone positioned within the housing at a bottom portion of the cooking chamber;
a lower heating element array positioned within the housing below the baking stone adjacent the bottom portion of the cooking chamber, the lower heating element array having a first zone and a second zone;
a pair of lower temperature sensors mounted to the baking stone, each of the temperature sensors of the pair of lower temperature sensors positioned adjacent a respective one of the first and second zones of the lower heating element array; and
a controller in operative communication with the upper heating element array, the lower heating element array, the pair of upper temperature sensors and the pair lower temperature sensors, the controller configured for independently operating each of the first zone of the upper heating element array, the second zone of the upper heating element array, the first zone of the lower heating element array and the second zone of the lower heating element array.

2. The oven appliance of claim 1, wherein the controller is configured for operating the first zone of the upper heating element array in response to temperature measurements from a first one of the pair of upper temperature sensors and for operating the second zone of the upper heating element array in response to temperature measurements from a second one of the pair of upper temperature sensors.

3. The oven appliance of claim 1, wherein the controller is configured for operating the first zone of the lower heating element array in response to temperature measurements from a first one of the pair of lower temperature sensors and for operating the second zone of the lower heating element array in response to temperature measurements from a second one of the pair of lower temperature sensors.

4. The oven appliance of claim 1, wherein the first zone of the upper heating element array is positioned at a front portion of the cooking chamber, the first zone of the lower heating element array is positioned below the baking stone adjacent the front portion of the cooking chamber, the second zone of the upper heating element array is positioned at a rear portion of the cooking chamber, the second zone of the lower heating element array is positioned below the baking stone adjacent the rear portion of the cooking chamber.

5. The oven appliance of claim 1, wherein the pair of lower temperature sensors are positioned within the baking stone.

6. The oven appliance of claim 5, wherein the pair of lower temperature sensors are positioned within the baking stone at a middle portion of the baking stone.

7. The oven appliance of claim 5, wherein the pair of lower temperature sensors are positioned within the baking stone at a top portion or a bottom portion of the baking stone.

8. The oven appliance of claim 1, wherein the upper heating element array and the lower heating element array are electrical heating element arrays.

9. The oven appliance of claim 8, wherein the upper heating element array and the lower heating element array comprise calrods.

10. The oven appliance of claim 1, wherein the controller is configured for regulating a power output of each of the first zone of the upper heating element array, the second zone of the upper heating element array, the first zone of the lower heating element array and the second zone of the lower heating element array by pulse-width modulation of a voltage supplied to a solid state relay.

11. An oven appliance, comprising:
a housing defining a cooking chamber;
an upper electrical heating element array positioned within the housing at a top portion of the cooking chamber, the upper electrical heating element array having a first zone and a second zone;
a pair of upper temperature sensors, each of the temperature sensors of the pair of upper temperature sensors positioned adjacent a respective one of the first and second zones of the upper electrical heating element array;
a baking stone positioned within the housing at a bottom portion of the cooking chamber;
a lower electrical heating element array positioned within the housing below the baking stone adjacent the bottom portion of the cooking chamber, the lower electrical heating element array having a first zone and a second zone;
a pair of lower temperature sensors positioned within the baking stone, each of the temperature sensors of the pair of lower temperature sensors positioned adjacent a respective one of the first and second zones of the lower electrical heating element array; and
a controller in operative communication with the upper electrical heating element array, the lower electrical heating element array, the pair of upper temperature sensors and the pair lower temperature sensors, the controller configured for independently operating the first zone of the upper heating electrical element in response to temperature measurements from a first one of the pair of upper temperature sensors and for independently operating the second zone of the upper electrical heating element array in response to temperature measurements from a second one of the pair of upper temperature sensors, the controller also configured for independently operating the first zone of the lower electrical heating element array in response to temperature measurements from a first one of the pair of lower temperature sensors and for independently operating the second zone of the lower electrical heating element array in response to temperature measurements from a second one of the pair of lower temperature sensors.

12. The oven appliance of claim 11, wherein the first zone of the upper electrical heating element array is positioned at a front portion of the cooking chamber, the first zone of the lower electrical heating element array is positioned below the baking stone adjacent the front portion of the cooking chamber, the second zone of the upper electrical heating element array is positioned at a rear portion of the cooking chamber, the second zone of the lower electrical heating element array is positioned below the baking stone adjacent the rear portion of the cooking chamber.

13. The oven appliance of claim 11, wherein the pair of lower temperature sensors are positioned within the baking stone at a middle portion of the baking stone.

14. The oven appliance of claim 11, wherein the pair of lower temperature sensors are positioned within the baking stone at a top portion or a bottom portion of the baking stone.

15. The oven appliance of claim 11, wherein the controller is configured for regulating a power output of each of the first zone of the upper electrical heating element array, the second zone of the upper electrical heating element array, the first zone of the lower electrical heating element array and the second zone of the lower electrical heating element array by pulse-width modulation of a voltage supplied to a solid state relay.

* * * * *